United States Patent [19]
Lee et al.

[11] Patent Number: 5,940,680
[45] Date of Patent: Aug. 17, 1999

[54] METHOD FOR MANUFACTURING KNOWN GOOD DIE ARRAY HAVING SOLDER BUMPS

[75] Inventors: Kyu Jin Lee, Seoul; Sang Hyeog Lee, Suwon; In Ho Hyun, Yongin-gun; Il Ung Kim, Seoul, all of Rep. of Korea

[73] Assignee: Samsung Electronics Co., Ltd., Kyungki-Do, Rep. of Korea

[21] Appl. No.: 08/854,587

[22] Filed: May 12, 1997

Related U.S. Application Data

[63] Continuation of application No. 08/371,073, Jan. 10, 1995, abandoned.

[30] Foreign Application Priority Data

Jan. 10, 1994 [KR] Rep. of Korea ............................ 94/274

[51] Int. Cl.⁶ .................................................. H01L 21/66
[52] U.S. Cl. .............................. 438/15; 438/613; 29/593; 257/48
[58] Field of Search ................................ 438/14, 15, 613, 438/17, 18; 29/593; 257/48

[56] References Cited

U.S. PATENT DOCUMENTS

| | | | |
|---|---|---|---|
| 3,585,461 | 6/1971 | Eynon et al. | 437/192 |
| 3,663,184 | 5/1972 | Wood et al. | 29/195 |
| 4,005,472 | 1/1977 | Harris et al. | 357/71 |
| 4,970,571 | 11/1990 | Yamakawa et al. | 357/71 |
| 5,060,051 | 10/1991 | Usuda | 437/192 |
| 5,173,451 | 12/1992 | Kinsman et al. | 437/209 |
| 5,216,278 | 6/1993 | Lin et al. | |
| 5,217,597 | 6/1993 | Moore et al. | 205/123 |
| 5,342,807 | 8/1994 | Kinsman et al. | 437/209 |
| 5,356,838 | 10/1994 | Kim | 437/226 |
| 5,359,768 | 11/1994 | Haley | 437/209 |
| 5,397,245 | 3/1995 | Roebuck et al. | 439/264 |
| 5,468,157 | 11/1995 | Roebuck et al. | 439/264 |

Primary Examiner—Donald L. Monin, Jr.
Assistant Examiner—Michael Dietrich
Attorney, Agent, or Firm—Pillsbury Madison & Sutro LLP

[57] ABSTRACT

A method for manufacturing a known good die array ("KGD" array), which includes the steps of: (a) forming a plurality of circuit patterns, and bonding pads to match solder bumps on a wafer; (b) providing solder bumps on the bonding pads; (c) forming metal layers for wire-bonding on the solder bumps; (d) dividing the wafer having metal layers into respective individual circuit pattern unit dies; (e) holding at least one die in a die holder for testing; (f) wire-bonding circuit contacts of the die holder with the metal layers using wires; (g) testing the die which is electrically interconnected with the die holder; and (h) removing simultaneously the metal layer on the solder bumps for wire bonding and the wires from the die to give a known good die array having solder bumps.

2 Claims, 3 Drawing Sheets

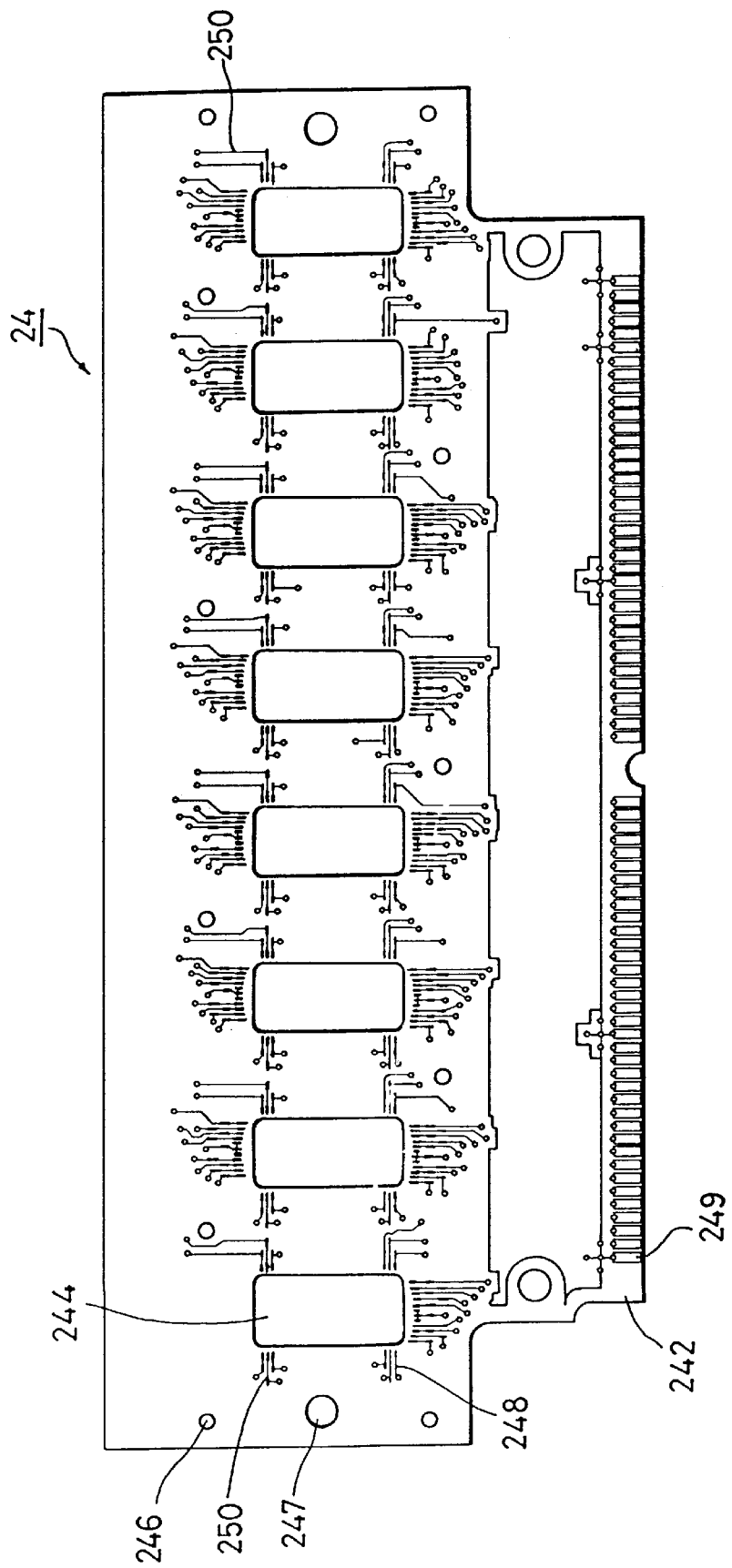

METHOD FOR MANUFACTURING KNOWN GOOD DIE ARRAY HAVING SOLDER BUMPS

This is a continuation of application Ser. No. 08/371,073, filed on Jan. 10, 1995 now abandoned.

BACKGROUND OF THE INVENTION

1. Field of the Invention

The Present invention is related to a method for manufacturing a known good die array(hereinafter, referred to as "KGD" array ) and more particularly it is related to a method for producing a KGD array having solder bumps suitable for use on flip-chips which may be advantageously employed for producing multi-chip modules.

2. Prior Art

Various semiconductor devices are manufactured through practicing a wafer process and a packaging process. A starting substrate, usually a thin wafer of silicon or gallium arsenide, is masked, etched, and doped through several process steps, the steps depending on the type of devices being manufactured. This process, called a "wafer process", yields a number of die on each wafer produced. The die are divided and packaged into individual components.

Recent trends of compactation of electronic appliances encourage developments in compact mounting technologies for semiconductor devices. The so-called multi-chip module is a representative example of compact mounting. In multi-chip module technology, a plurality of bare chips are interconnected to each other on a printed wiring board.

Multi-chip module technology may be classified depending on the patterns of mounting bare chips on the printed wiring board into three groups: wire bonding, tape automated bonding, and flip-chip technologies. The flip-chip technologies, wherein the electrical interconnection lengths between the dies and the printed wiring board are shorter than those of other two technologies, are widely employed because handling is easy, the circuit performance is good and the cost is low.

In multi-chip module technology, the dies are subjected to alternating current (AC) and burn-in tests before being interconnected to each other. The tests may be conducted by employing a probe during the wafer process; by employing a tape automated bonding which is removed after testing; or by temporarily bonding the chip lead wires to ceramic packages for the chips.

In conventional multi-chip module manufacture using flip-chip technologies, solder bumps cannot be formed until the tests are conducted. Rather, they are formed on individual dies after the testing has been connected because the electrical connections are made between bare chips and test sockets. This causes a decrease in the workability and reliability of devices and an increase of production costs.

The reason why solder bumps cannot be formed until the tests are conducted is that, although the above-described test methods need a removal of wire or electrical interconnection members after the tests are conducted, the physical bonding or electrical interconnection between solder bumps and wires or mechanical properties thereof, did not allow a manufacturer to do so. Therefore, solder bumps cannot heretofore have not been able to be formed during the wafer process before the tests were conducted.

Thus, there has been a need to provide a method or apparatus to allow solder bumps to be formed the bonding pads of die during the wafer process before the tests are conducted.

SUMMARY OF THE INVENTION

Thus, an object of the invention is provide a method for manufacturing a known good die array("KGD" array), which comprises the following steps:

(a) forming a plurality of circuit patterns, and bonding pads to match solder bumps on a wafer;

(b) providing solder bumps on the bonding pads;

(c) forming metal layers for wire-bonding on the solder bumps;

(d) dividing the wafer having metal layers into respective individual circuit pattern unit dies;

(e) holding at least one unit die in a die holder for testing;

(f) wire-bonding circuit contacts of the die holder with metal layers using wires;

(g) testing the die which is electrically interconnected with the die holder; and (h) removing simultaneously the metal layer on the solder bumps for wire bonding and the wires from the die, to give a known good die array having solder bumps.

The metal layers for wire-bonding may be formed from any one of aluminum(Al), gold(Au), silver(Ag), chromium (Cr), copper(Cu), and nickel(Ni), or mixtures thereof.

The metal layer protects the solder bumps and reduces the stress of tests, thereby making it possible to form the solder bumps during the wafer process, before the tests.

The wire bonding in the step (f) is gold or aluminum ball bonding.

The metal layer formed for wire bonding may be removed by using a laser beam, steel blade or diamond blade cutting technology. By removing the metal layer after the tests have been conducted, it is possible to improve the interconnections and reliability of flip-chip mounting using solder bumps.

BRIEF DESCRIPTION OF THE DRAWINGS

For a more complete understanding of the present invention and for further advantages thereof, reference is now made to the following detailed description, taken in conjunction with the accompanying drawings, in which:

FIG. 4 is a plan view showing the printed wiring board of FIG. 2.

DETAILED DESCRIPTION OF THE INVENTION

Referring to FIGS. 1(A) through 1(E), which schematically show the methods according to the present invention, a plurality of same circuit patterns are formed and bonding pads (12) to attach solder bumps are provided by a common semiconductor chip manufacturing process. Then, solder bumps (14) are formed on the bonding pads (12).

Figure 1A:
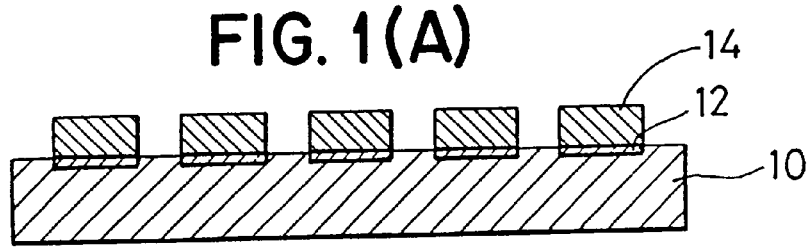
FIGS. 1(A) through 1(E) are process chart drawings schematically showing the methods according to the present invention.
Figure 1B:
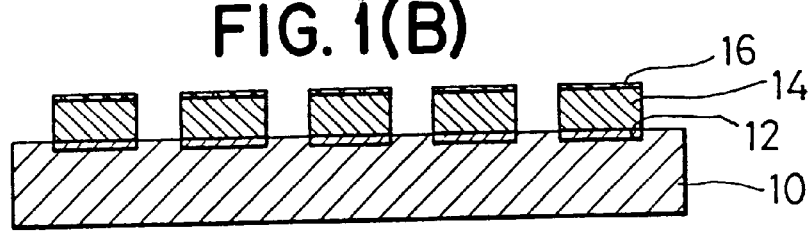

In FIG. 1(B), metal layers (16) are formed on the respective solder bumps (14) to allow a wire-bonding. The metal layers (16) may be formed from any one of aluminum(Al), gold(Au), silver(Ag), chromium(Cr), copper(Cu), and nickel (Ni), or mixtures thereof.

Then, the wafer 10 having metal layers is divided into respective individual circuit pattern unit dies and at least one die is held in a die holding device (20) for testing.

Figure 2:
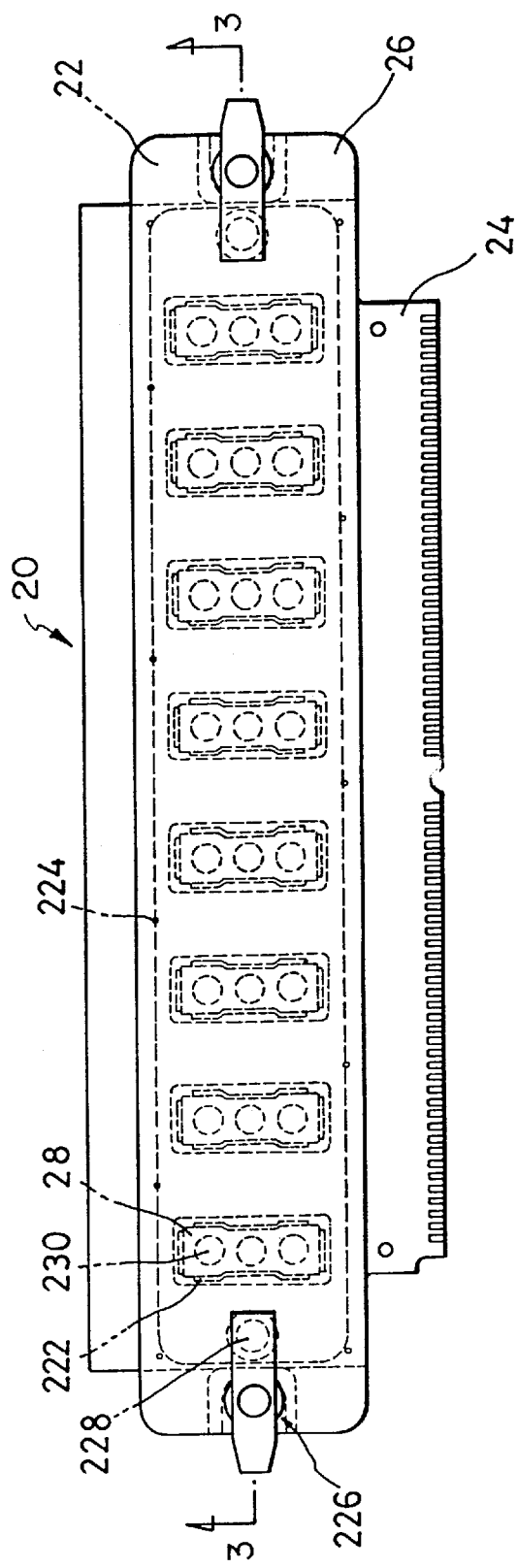
FIG. 2 is a plan view showing a die holder for testing multi-chip module, which is used for testing the known good die array having solder bumps according to the present invention.
Figure 3:
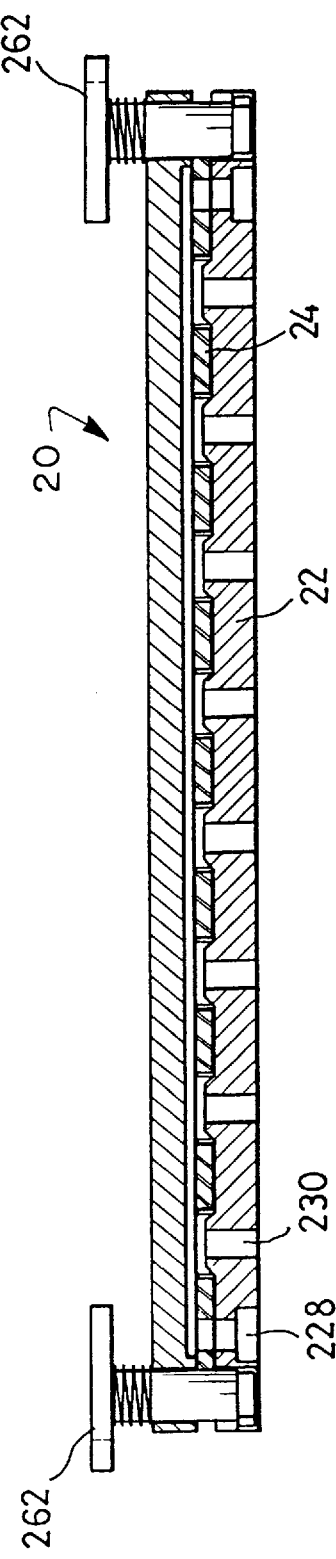
FIG. 3 is a cross-sectional view along the line 3—3 of FIG. 2.

Referring to FIGS. 2 through 4, the die holding device (20) for testing multi-chip module comprises a die holder (22), a printed wiring board (24) and a cap (26). The die holder (22) is provided with a plurality of die sockets (222), positioning bumps (224), grooves (226) and screw holes (228). There are a plurality of vacuum suction holes (230) provided below the die sockets (222) so that dies can mounted on and held in the die sockets (222).

The printed wiring board (24) is provided with a contacting part (242) which is plugged into a test socket, through holes (244) into which die sockets (222) are inserted, positioning holes (246) into which positioning bumps (224) are inserted, and screw holes (247).

There are formed landing patterns (248) for wire-bonding with dies around the through holes (244).

Multi-layers of wiring patterns (250) are formed between the landing patterns (248) and contacting patterns (249) of the contacting part (242).

Cap (26) is provided with elastic fixing members (262) having engaging projections which are engaged to projections formed in the grooves (226) of the die holder (22).

Accordingly, the die holding device (20) can fix the printed wiring board (24) to the die holder (22) by mounting the dies (28) on the die sockets (222) of the die holder (22), placing the printed wiring board (24) on the dies (28) and tieing up the screw holes (228) and screw holes (227) with screws.

Figure 1C:
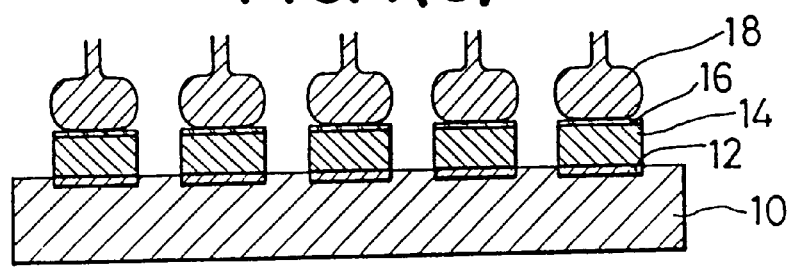

Then, as shown in FIG. 1(C), the metal layers (16) on the solder bumps (14) of the dies (28) which are projected through the spaces (244) are interconnected to the landing patterns (248) through gold ball bonding wires (18). Thereafter, the cap (26) is placed on the die holder (20) via the printed wiring board (24). By inserting the elastic fixing members (262) into the grooves (226) of the die holder (22) and pressing with rotation the fixing members (262) to engage their engaging projections to the projections of the grooves, it is possible to prevent a contamination of the die with the cap (26) during the testing process.

Thereafter, the contacting part (242) of the die holding device (20) is plugged into the test socket and subjected to alternating and burn-in tests.

Figure 1D:
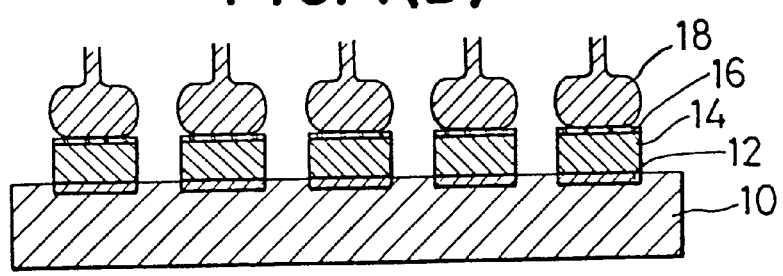
Figure 1E:
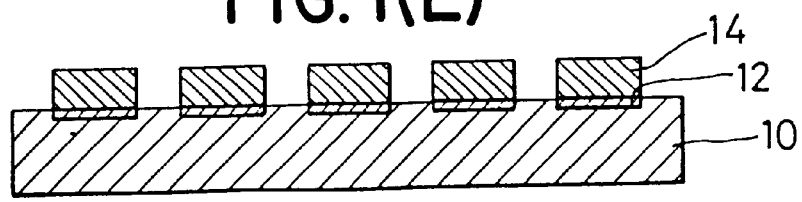

After the tests are conducted, as shown in FIGS. 1(D) and 1(E), the metal layer (16) is removed from the solder bumps of the die (28) by using any conventional technique, such as laser beam, steel blade or diamond blade cutting technology, to give a known good die array having solder bumps (14) on the bonding pads (12).

In accordance with the present invention, by forming a metal layer for wire-bonding on the solder bumps, it is possible to electrically connect to the test socket by wire-bonding through the metal layer to conduct AC and burn-in tests; and after conducting the tests by removing the metal layer, the die may be matched to a chip by flip-chip technology.

If wire-bonding or tape automated bonding is carried out to conduct tests without forming a metal layer on the solder bumps, the contacting parts of the solder bump are contaminated and eventually result in a poor contact or electric connection during the flip-chip bonding. The present invention avoids such problems by forming a metal layer on the solder bump of each die and has advantages that reliability of the multi-chip or hybrid module can be improved. Further, the present invention is advantageous in that the workability can be improved because the solder bumps can be formed on all the dies during the wafer process.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. A method for manufacturing a known good die array, which comprises the steps of:

(a) forming a plurality of circuit patterns and bonding pads on a wafer;

(b) providing solder bumps on the bonding pads;

(c) forming a metal layer made of at least one metal selected from the group consisting of aluminum, gold, silver, chromium, copper and nickel, for wire-bonding on the solder bumps;

(d) dividing the wafer having said metal layer on said solder bumps into respective individual circuit pattern unit dies each including at least one said solder bump having said metal layer thereon;

(e) holding a plurality of said dies in a die holder for testing;

(f) wire-bonding at least one circuit contact of the die holder with said metal layer of the respective ones of said dies using respective gold bonding wires, thereby electrically interconnecting the respective ones of said dies with the die holder;

(g) testing each die which is electrically interconnected with the die holder; and (h) removing simultaneously said metal layer and said gold bonding wire from each die tested in step (g) to give a known good die array in which each die tested in step (g) has at least one said solder bump remaining thereon.

2. The method as claimed in claim 1, wherein the metal layers are removed by a laser beam, steel blade or diamond blade cutting technology.

* * * * *